(12) United States Patent
Lin et al.

(10) Patent No.: US 8,981,451 B2
(45) Date of Patent: *Mar. 17, 2015

(54) SEMICONDUCTOR MEMORY DEVICES

(71) Applicant: MACRONIX International Co., Ltd., Hsinchu (TW)

(72) Inventors: Cheng-Chi Lin, Hsinchu (TW); Shih-Chin Lien, Hsinchu (TW); Shyi-Yuan Wu, Hsinchu (TW); Chin-Pen Yeh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/922,086

(22) Filed: Jun. 19, 2013

(65) Prior Publication Data

US 2013/0277725 A1    Oct. 24, 2013

Related U.S. Application Data

(62) Division of application No. 12/876,711, filed on Sep. 7, 2010, now Pat. No. 8,487,360.

(30) Foreign Application Priority Data

Nov. 25, 2009  (TW) ................. 98140217 A

(51) Int. Cl.
*H01L 27/07* (2006.01)
*H01L 27/06* (2006.01)
*H01L 29/66* (2006.01)
*H01L 29/788* (2006.01)
*H01L 27/115* (2006.01)

(52) U.S. Cl.
CPC ....... *H01L 27/0629* (2013.01); *H01L 27/11558* (2013.01); *H01L 29/66825* (2013.01); *H01L 29/7881* (2013.01)
USPC .................................. 257/315; 257/E27.016

(58) Field of Classification Search
None
See application file for complete search history.

(56) References Cited

U.S. PATENT DOCUMENTS 7,279,738 B2 * 10/2007 Khan et al. .................... 257/315
2007/0215934 A1 * 9/2007 Tagaki ......................... 257/315

* cited by examiner

*Primary Examiner* — Wensing Kuo
(74) *Attorney, Agent, or Firm* — J.C. Patents

(57) ABSTRACT

A semiconductor memory device includes a substrate, a well region in the substrate, a patterned first dielectric layer on the substrate extending over the well region, a patterned first gate structure on the patterned first dielectric layer, a patterned second dielectric layer on the patterned first gate structure, and a patterned second gate structure on the patterned second dielectric layer. The patterned first gate structure includes a first section extending in a first direction and a second section extending in a second direction orthogonal to the first section, the first section and the second section intersecting each other in a cross pattern. The patterned second gate structure includes at least one of a first section extending in the first direction over the first section of the patterned first gate structure or a second section extending in the second direction over the second section of the patterned first gate structure.

8 Claims, 14 Drawing Sheets

SEMICONDUCTOR MEMORY DEVICES

CROSS REFERENCE TO RELATED APPLICATION(S)

This application is a divisional application of and claims the priority benefit of U.S. application Ser. No. 12/876,711, filed on Sep. 7, 2010, now allowed, which claims the priority benefit of Taiwan application serial no. 98140217, filed on Nov. 25, 2009. The entirety of each of the above-mentioned patent applications is hereby incorporated by reference herein and made a part of specification.

BACKGROUND OF THE INVENTION

The present invention relates generally to a memory device and, more particularly, to a semiconductor memory device and a method of fabricating the same.

Gate coupling ratio (GCR) is one of the important features of flash memory devices such as erasable programmable read-only memory (EPROM), electrically erasable programmable read-only memory (EEPROM) and flash memory. A flash memory device with a higher GCR may exhibit a lower operating voltage and operate at a faster device speed.

FIG. 1A is a cross-sectional diagram illustrating a memory cell 1 having a single poly-silicon gate structure in prior art. Referring to FIG. 1A, the memory cell 1 includes a p-type substrate 10, an n-well 11, a transistor 14, an isolator 12 and a control terminal 19. A gate conductor 17 of the transistor 14 and a conductor 18 over the n-well 11, which are electrically coupled to each other (not shown) and formed in a single layer, constitute the single poly-silicon gate structure. The GCR may represent a voltage in the conductors 17 and 18 induced by an external voltage applied to the control terminal 19, and may be expressed as a function of relevant capacitances of the memory cell 1 in Equation (1) below.

$$GCR = \frac{C_1}{C_1 + C_2} \quad \text{Equation (1)}$$

where $C_1$ represents the capacitance defined by the gate layer 17, a dielectric layer 15 and the n-well 11, and $C_2$ represents the capacitance defined by the gate layer 18, a dielectric layer 16 and the substrate 10. FIG. 2 is a diagram shows an equivalent circuit of the capacitors $C_1$ and $C_2$, which are connected in series.

To obtain a relatively high GCR, an additional capacitor in parallel with the capacitor $C_1$ may be added, thereby increasing the total capacitance each in the numerator and denominator of Equation (1). Accordingly, it may be desirable to have a semiconductor memory device that has a relatively high GCR to reduce the operating voltage and enhance the device speed. It may also be desirable to have a method of manufacturing a semiconductor memory device having a relatively high GCR without increasing the size of the memory device.

BRIEF SUMMARY OF THE INVENTION

The present invention is directed to a semiconductor memory device and a method of manufacturing the same that may achieve relatively high gate coupling ratio.

Examples of the present invention may provide a semiconductor memory device that comprises a substrate of a first impurity type, a first well region of a second impurity type in the substrate, the second impurity type being different from the first impurity type, a second well region of the first impurity type in the substrate, a patterned first dielectric layer on the substrate extending over the first and second well regions, a patterned first gate structure on the patterned first dielectric layer, a patterned second dielectric layer on the patterned first gate structure, and a patterned second gate structure on the patterned second dielectric layer. The patterned first gate structure may include a first section extending in a first direction and a second section extending in a second direction orthogonal to the first section. The first section and the second section may intersect each other in a cross pattern. The patterned second gate structure may include at least one of a first section extending in the first direction over the first section of the patterned first gate structure or a second section extending in the second direction over the second section of the patterned first gate structure.

Some examples of the present invention may also provide a semiconductor memory device that comprises a substrate, a well region in the substrate having a same impurity type as the substrate, a patterned first dielectric layer on the substrate extending over the well region, a patterned first gate structure on the patterned first dielectric layer, a patterned second dielectric layer on the patterned first gate structure, and a patterned second gate structure on the patterned second dielectric layer. The patterned first gate structure may include a first section extending in a first direction and a second section extending in a second direction orthogonal to the first section. The first section and the second section may intersect each other in a cross pattern. The patterned second gate structure may include at least one of a first section extending in the first direction over the first section of the patterned first gate structure or a second section extending in the second direction over the second section of the patterned first gate structure.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings.

DETAILED DESCRIPTION OF THE INVENTION

Reference will now be made in detail to the present examples of the invention, which are illustrated in the accompanying drawings. Wherever possible, the same reference numbers will be used throughout the drawings to refer to the same or like portions.

Figure 1A:
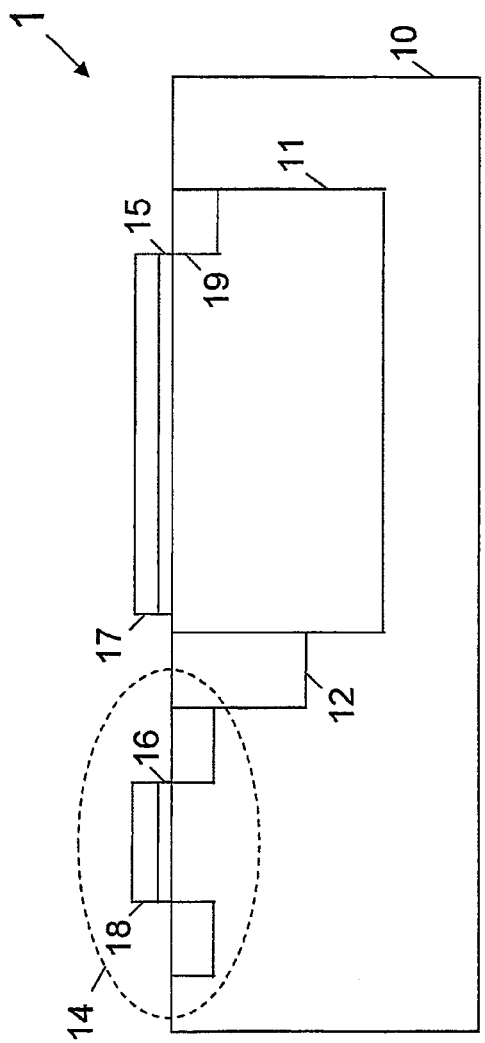
FIG. 1A is a cross-sectional diagram illustrating a memory cell having a single poly-silicon gate structure in prior art.
Figure 1B:
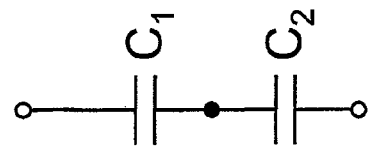
FIG. 1B is a diagram illustrating an equivalent circuit of the relevant capacitors of the memory cell illustrated in FIG. 1A.
Figure 2A:
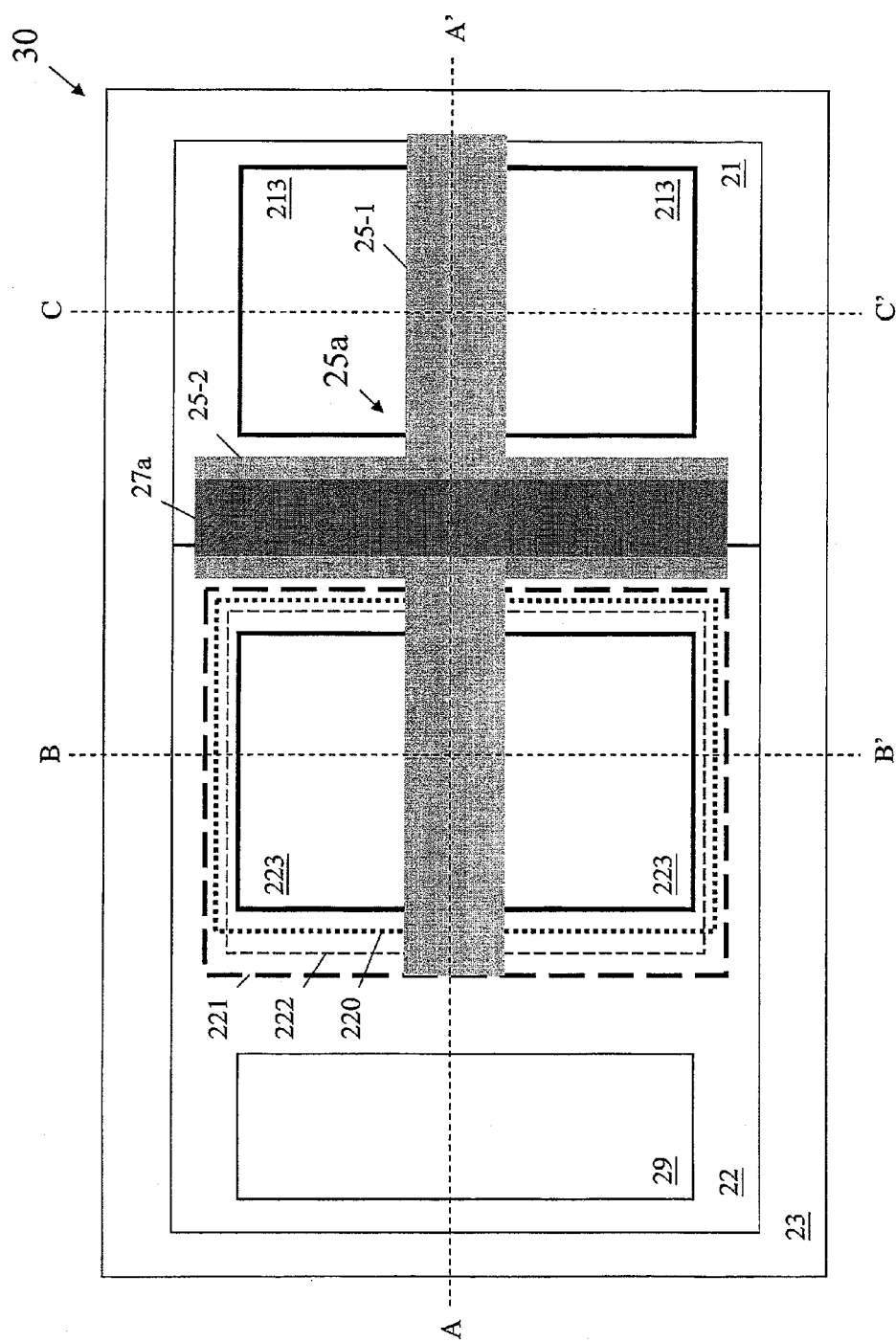
FIG. 2A is a plan view of a memory cell in accordance with an example of the present invention.

FIG. 2A is a plan view of a memory cell 30 in accordance with an example of the present invention. The memory cell 30 may serve as a storage unit in a semiconductor memory device that includes an array of such cells 30. For simplicity, only a memory cell instead of the whole array of cells of the semiconductor memory device is illustrated.

Referring to FIG. 2A, the memory cell 30 may include a patterned first gate structure 25a, a patterned second gate structure 27a, a first capacitor defined in an n-type well region 21, a second capacitor defined in a p-type well region 22 and isolation regions 23. The isolation regions 23 may substantially surround the patterned first and second gate structures 25a and 27a and electrically isolate the memory cell 30 from other memory cells in a memory array.

The memory cell 30 may further include doped regions such as first doped regions 213 to serve as a first pair of source/drain regions in the n-well 21, second doped regions 223 to serve as a second pair of source/drain regions in the p-well 22 and a pick-up region 29 in the p-well 22. Moreover, the memory cell 30 may optionally include lightly doped drain (LDD) regions 220, pocket regions 221 and hot carrier (HC) implant regions 222. The above-mentioned doped regions will be discussed in paragraphs below by reference to FIGS. 3A to 3O.

The patterned first gate structure 25a may serve as a floating gate for the memory cell 30, and may further include a first section 25-1 and a second section 25-2, which may intersect each other in a cross pattern. Specifically, the first section 25-1 may extend lengthwise in a first direction along a line corresponding to line AA' and the second section 25-2 may extend crosswise in a second direction substantially orthogonal to the first direction. Furthermore, the patterned second gate structure 27a may extend in the second direction over the second section 25-2 of the patterned first gate structure 25a. The patterned second gate structure 27a, which may entirely overlap the second section 25-2, has an area equal to or smaller than that of the second section 25-2.

The first capacitor (not numbered) may be defined by the n-well 21, the patterned first gate structure 25a and in particular the first section 25-1 over the n-well 21, and a first dielectric layer (the patterned first dielectric layer 24a illustrated in FIG. 3O) between the n-well 21 and the first section 25-1.

Moreover, the second capacitor (not numbered) may be defined by the p-well 22, the patterned first gate structure 25a and in particular the first section 25-1 over the p-well 21, and the first dielectric layer (the patterned first dielectric layer 24a illustrated in FIG. 3O) between the p-well 22 and the first section 25-1.

Furthermore, the patterned second gate structure 27a, the second section 25-2 and a second dielectric layer (the patterned second dielectric layer 26a illustrated in FIG. 3O) therebetween may together define a third capacitor that may increase the gate coupling ratio (GCR) of the memory cell 30, which will be discussed in paragraphs below.

Figure 2B:
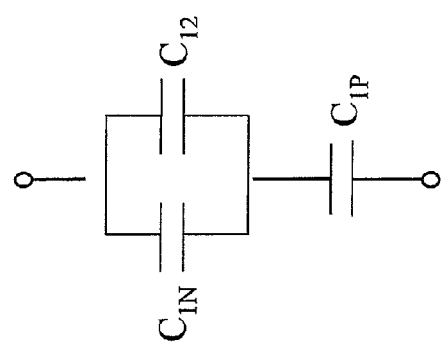
FIG. 2B is a diagram illustrating an equivalent circuit of the relevant capacitors of the memory cell illustrated in FIG. 2A.

FIG. 2B is a diagram illustrating an equivalent circuit of the relevant capacitors of the memory cell 30 illustrated in FIG. 2A. Referring to FIG. 2B, the GCR of the memory cell 30, denoted as GCR', may be expressed as a function of the relevant capacitances of the memory cell 30 in Equation (2) below.

$$GCR' = \frac{C_{12} + C_{1N}}{C_{12} + C_{1N} + C_{1P}} \qquad \text{Equation (2)}$$

where $C_{1N}$, $C_{1P}$ and $C_{12}$ represent respectively the capacitances of the first, second and third capacitors previously discussed.

The GCR' of the memory cell 30 in Equation (2) is greater than the GCR of the prior art memory cell 1 in Equation (1). Specifically, the memory cell 30 with the patterned second gate structure 27a over the patterned first gate structure 25a has a greater GCR than the prior art memory cell 1 absent from the patterned second gate structure 27a. That is, due to $C_{12}$, $$GCR'\left(=\frac{C_{12}+C_{1N}}{C_{12}+C_{1N}+C_{1P}}\right)$$

is greater than $$GCR\left(=\frac{C_{1N}}{C_{1N}+C_{1P}}\right).$$

Figure 3A:
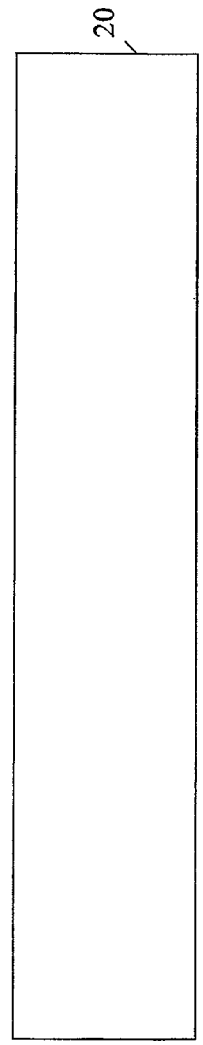
FIGS. 3A to 3O are cross-sectional diagrams illustrating a method of fabricating the memory cell illustrated in FIG. 2A in accordance with an example of the present invention.

FIGS. 3A to 3O are cross-sectional diagrams illustrating a method of fabricating the memory cell 30 illustrated in FIG. 2A in accordance with an example of the present invention. Referring to FIG. 3A, a substrate 20 formed of silicon, which has been doped with a first impurity type, is provided. In one example, the first impurity type may include a p-type material such as boron or indium. In another example, however, the first impurity type may include an n-type material such as phosphor or antimony. For simplicity, throughout the examples, it may be assumed that the first impurity type is the p-type and the second impurity type is the n-type.

Figure 3B:
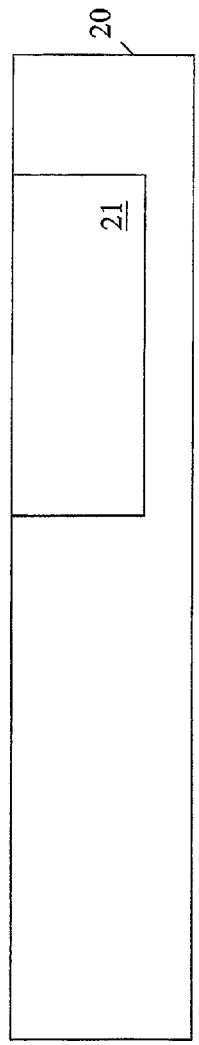

Referring to FIG. 3B, a first well region of the second impurity type, that is, an n-well 21, may be formed in the substrate 20 by, for example, a lithography process followed by an n-type implantation process.

Figure 3C:
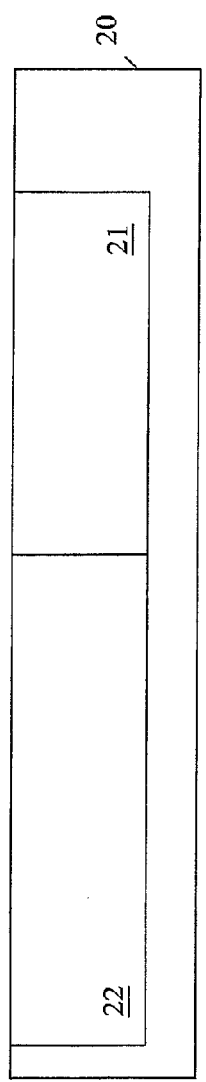

Referring to FIG. 3C, a second well region of the first impurity type, that is, a p-well 22, may be formed in the substrate 20 by a lithography process and a p-type implantation process. The p-type well region 22 and the n-type well region 21 may be adjacent to each other. Although in the present example n-well 21 is formed prior to p-well 22, skilled persons in the art will understand that the sequences of forming such n-well and p-well may be interchangeable and thus p-well 22 may be formed prior to n-well 21 in other examples.

Figure 3D:
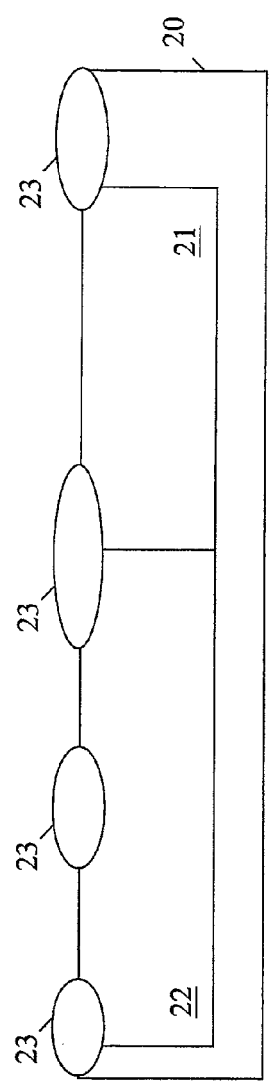

Referring to FIG. 3D, isolation regions 23 may be formed at desired locations on the substrate 20 using, for example, a thermal oxidation process. In one example, the isolation regions 23 may include but are not limited to silicon oxide such as silicon dioxide ($SiO_2$). Moreover, the isolation regions 23 may include field oxide (FOX) structures, which may be grown on the substrate 20 by an oxidation process. Alternatively, the isolation regions 23 may include shallow trench isolation (STI) structures, which may be formed by a lithography process and an etching process followed by an oxidation process. The isolation regions 23 may have a thickness ranging from approximately 4000 to 6000 Å but may be thinner or thicker.

Figure 3E:
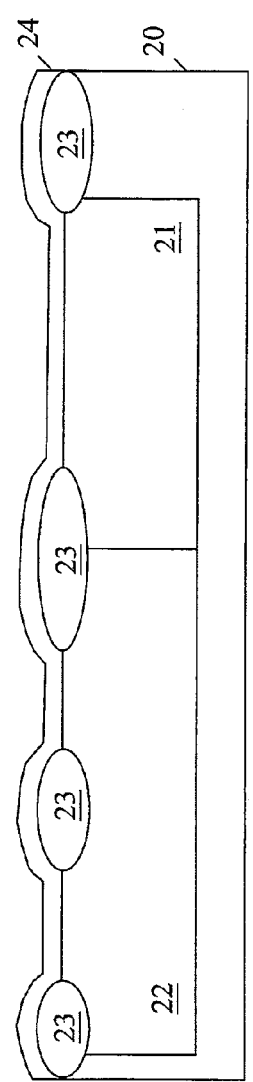

Referring to FIG. 3E, a first dielectric layer 24 to serve as a first gate oxide may be formed over the isolation regions 23 and the substrate 20 by, for example, a deposition process. In one example, the first dielectric layer 24 may include but is not limited to $SiO_2$. Furthermore, the first dielectric layer 24 may have a thickness ranging from approximately 100 to 130 Å.

Figure 3F:
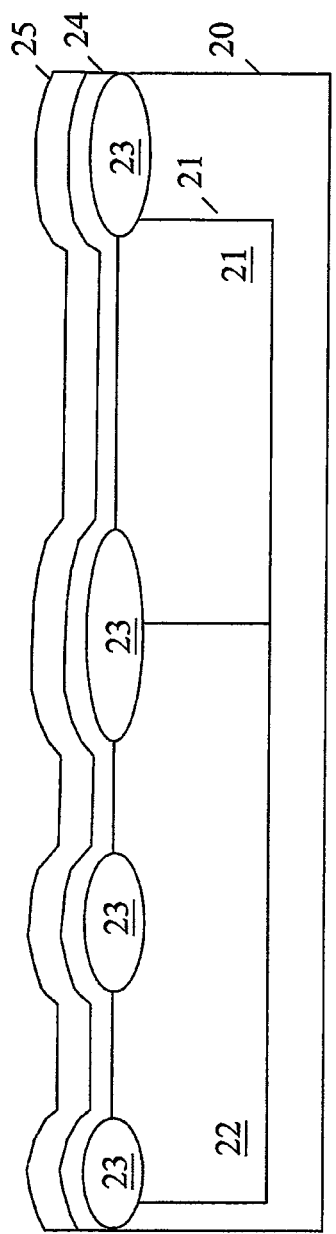

Referring to FIG. 3F, a first gate structure 25 may be formed over the first dielectric layer 24 by, for example, a deposition process. In one example, the first gate structure 25 may include a polycrystalline silicon (poly-Si) layer ranging from approximately 3000 to 5000 Å. In another example, the first gate structure 25 may include a tungsten polycide gate, which may further include a tungsten silicide ($WSi_x$ such as $WSi_2$) layer ranging from approximately 1000 to 3000 Å stacked on a poly-Si layer ranging from approximately 1000 to 3000 Å.

Figure 3G:
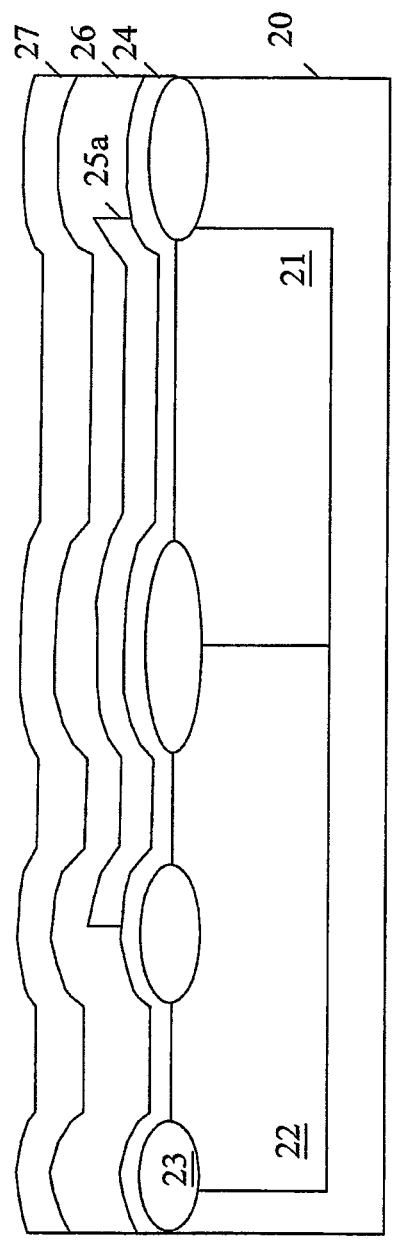

Referring to FIG. 3G, a patterned first gate structure 25a may be formed by, for example, a lithography process followed by an etch process. Specifically, a photoresist layer (not shown) may be coated over the first gate structure 25 and then a patterned photoresist layer may be defined through a mask. Subsequently, portions of the first gate structure 25 may be removed by one or more etchant that has a higher selectivity for poly-Si and $WSi_x$ than for photoresist. The patterned photoresist layer is then stripped. The patterned first gate structure 25a includes the first section 25-1 and the second section 25-2 in a cross pattern as illustrated in FIG. 2A.

Next, a second dielectric layer 26 and a second gate structure 27 may be formed in sequence over the first dielectric layer 24 and the patterned first gate structure 25a, each by, for example, a deposition process. In one example, the second dielectric layer 26 may include but is not limited to $SiO_2$ and have a thickness ranging from approximately 100 to 1000 Å. Furthermore, the second gate structure 27 may include a structure similar to that of the first gate structure 25 described and illustrated with reference to FIG. 2F. That is, the second gate structure 27 may include a single layer of poly-Si having a thickness ranging from approximately 3000 to 5000 Å, or alternatively a stacked structure that further includes a poly-Si layer ranging from approximately 1000 to 3000 Å and a tungsten silicide ($WSi_x$) layer ranging from approximately 1000 to 3000 Å stacked on the poly-Si layer.

Figure 3H:
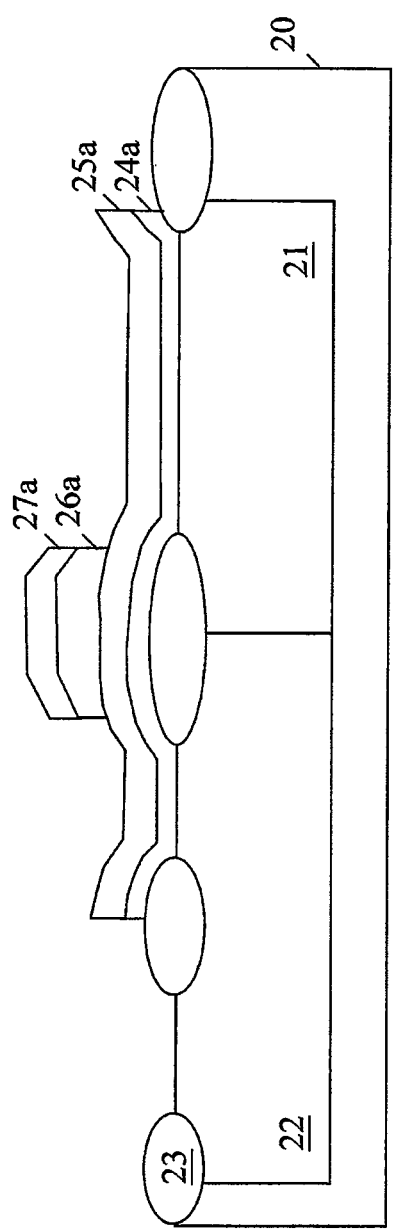

Referring to FIG. 3H, a patterned second gate structure 27a may be formed by, for example, a lithography process followed by an etch process. As previously discussed, the patterned second gate structure 27a may extend over the second section 25-2 of the patter second gate structure 25a in the second direction.

Subsequently, a patterned second dielectric layer 26a and a patterned first dielectric layer 24a may then be formed by an etch process using an etchant that has a higher selectivity for silicon oxide than for poly-Si and $WSi_x$. The patterned second dielectric layer 26a and patterned first dielectric layer 24a may expose portions of the isolation regions 23, p-well 22 and substrate 20. Furthermore, the patterned second dielectric layer 26a, like the patterned second gate structure 27a, may extend over the second section 25-2 of the patter second gate structure 25a in the second direction. Moreover, the patterned first dielectric layer 24a may be formed in a pattern similar to that of the patterned first gate structure 25a. Specifically, the patterned first dielectric layer 24a may include a first section (not shown) extending in the first section under the first section 25-1 and a second section (not shown) extending in the second direction under the second section 25-2 of the patter second gate structure 25a.

Figure 3I:
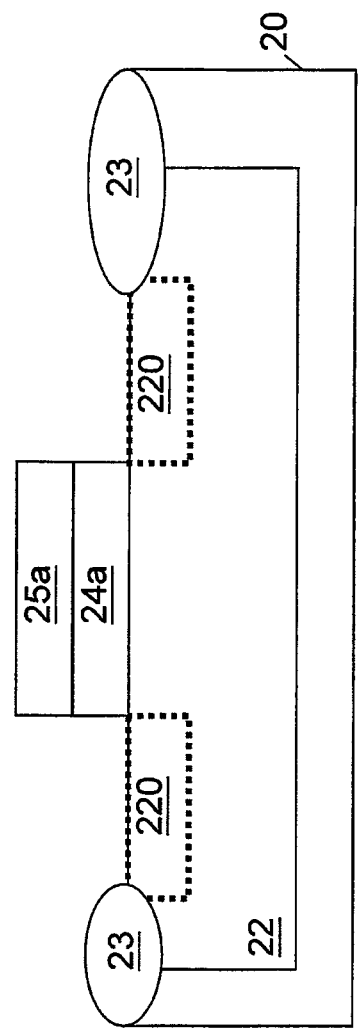
Figure 3J:
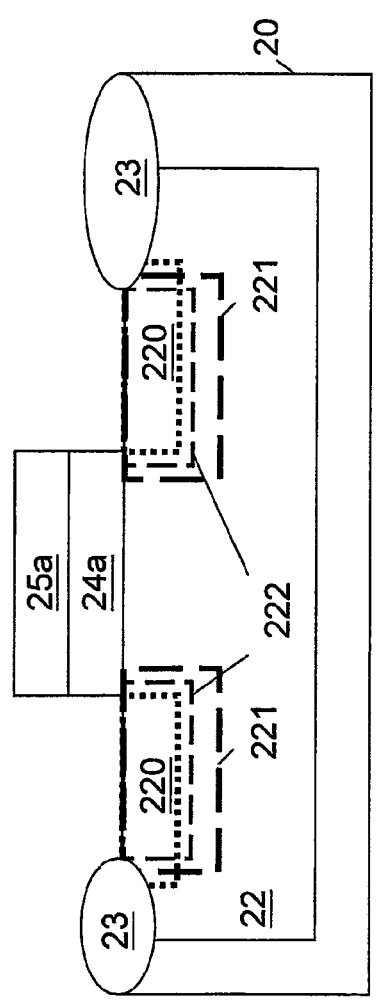

The preceding cross-sectional views of FIGS. 3A to 3H are taken along a line corresponding to line AA' in FIG. 2A. The following cross-sectional views of FIGS. 3I and 3J are taken along a line corresponding to line BB' in FIG. 2A. Referring to FIG. 3I, after the patterned second gate structure 27a in FIG. 3H is formed, LDD regions 220 at both sides of the first section 25-1 over the p-well 22 may optionally be formed in the p-well 22 by, for example, an n-type implantation process using the first section 25-1 of the patterned first gate structure 25a as a mask. The dosage and implant energy in the implantation process may be chosen so that the LDD regions 220 may have a lower concentration and a smaller depth than the subsequent source/drain regions. The LDD regions 220 may function to alleviate hot carrier effects.

Referring to FIG. 3J, pocket regions 221 and HC implant regions 222 may optionally be formed in the p-well 22 at both sides of the first section 25-1 over the p-well 22 each by, for example, an implantation process. The pocket regions 221 may facilitate the adjustment of threshold voltage. Moreover, the HC implant regions 222, which may use boron or phosphor as a dopant, may improve hot carrier reliability.

Figure 3K:
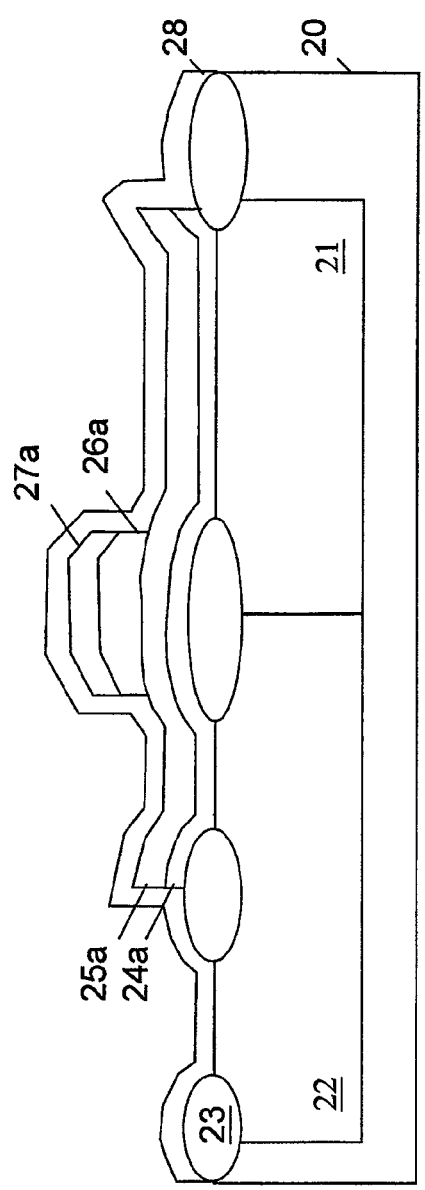
Figure 3L:
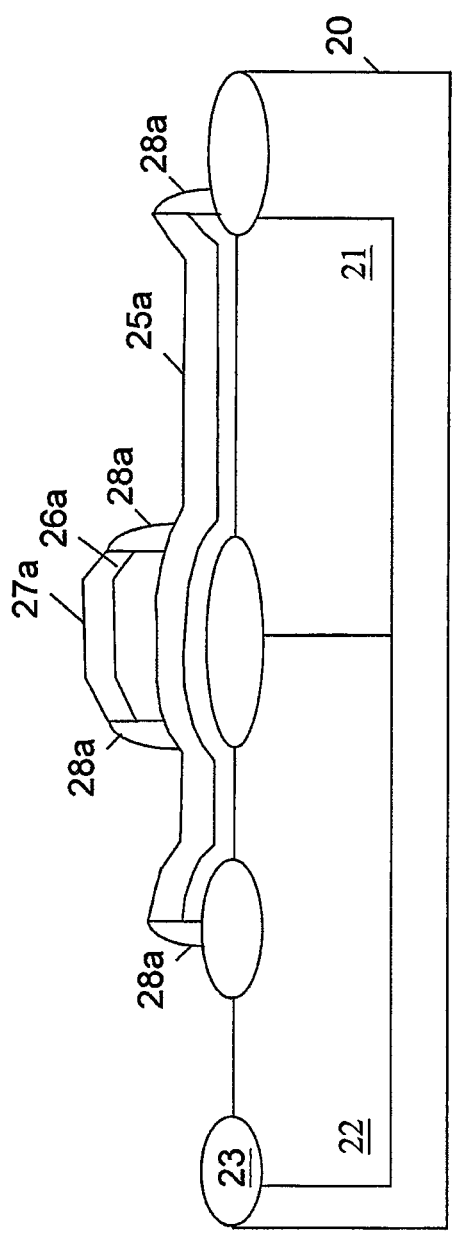

FIGS. 3K and 3L are cross-sectional views taken along the line AA' in FIG. 2A. Referring to FIG. 3K, after the doped regions 220 to 222 in FIG. 3J are formed, a third dielectric layer 28 may be formed over the patterned second gate structure 27a and the exposed isolation regions 23 and substrate 20 by, for example, a deposition process. In one example, the third dielectric layer 28 may include tetraethoxysilane (TEOS) or TEOS silicon oxide such as $TEOS\text{-}SiO_x$ and have a thickness ranging from 1000 to 4000 Å. Furthermore, the third capacitor $C_{12}$ may thus be defined by the patterned second gate structure 27a, the patterned first gate structure 25a and the patterned second dielectric layer 26a therebetween.

Referring to FIG. 3L, a patterned third dielectric layer 28a may be formed by, for example, a lithography process followed by an etch process. The patterned third dielectric layer 28a, which may serve as a spacer, exposes the patterned first and second gate structures 25a and 27a.

Figure 3M:
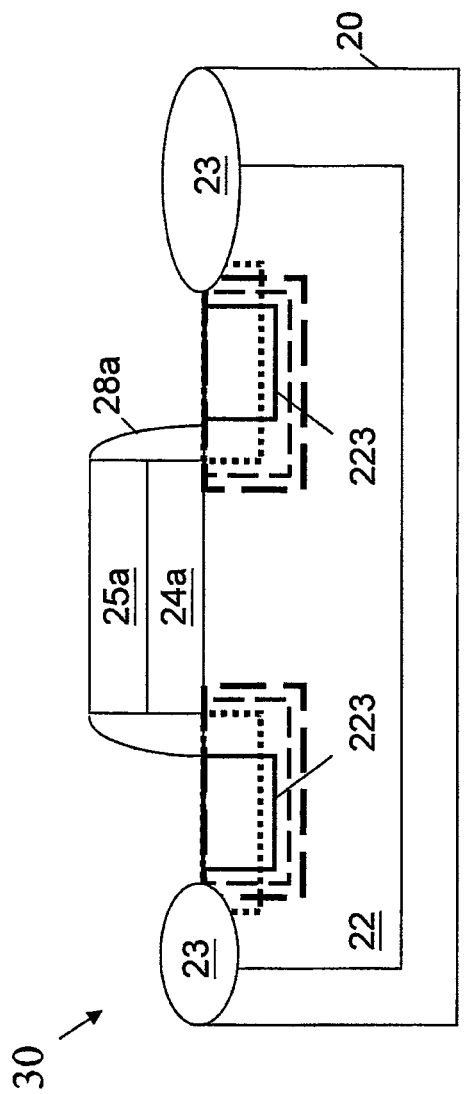
Figures 3N, 3O:
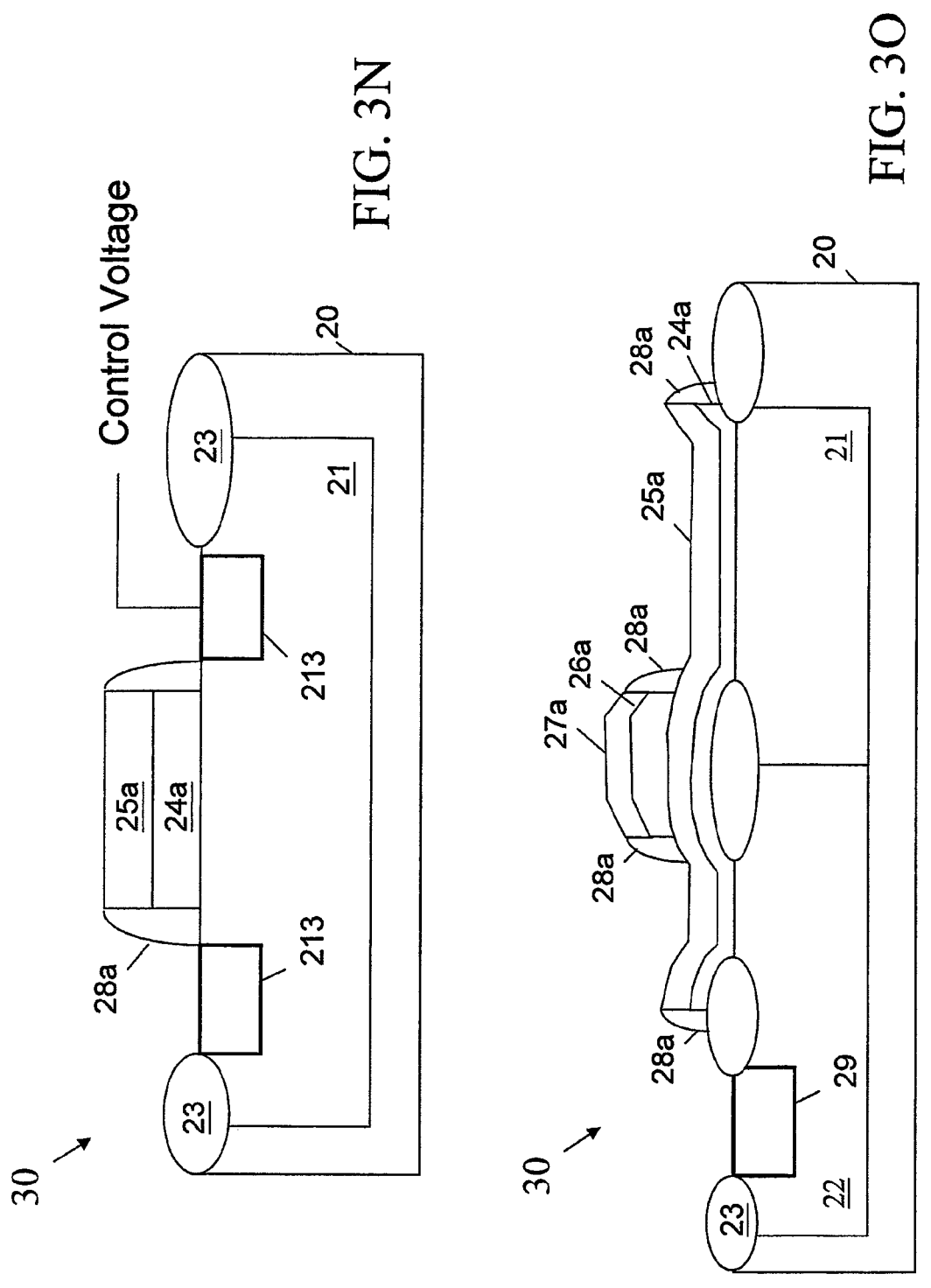

Using the patterned first gate structure 25a together with the spacer 28a as a mask, source/drain regions 223 in the p-well 22 and source-drain regions 213 in the n-well 21 may be formed by, for example, an n-type implantation process, as respectively illustrated in FIG. 3M taken along the line BB' and FIG. 3N taken along a line corresponding to line CC' in FIG. 2A. Referring to FIG. 3M, the second capacitor $C_{1p}$ may thus be defined by the patterned first gate structure 25a over the p-well 22, the p-well region 22 and the patterned first dielectric layer 24a therebetween.

In another example, the optional regions 220 to 222 shown in FIGS. 3I and 3J are not formed. In that case, the source/drain regions 223 in the p-well 22 and source-drain regions 213 in the n-well 21 may be formed after the patterned second gate structure 27a in FIG. 3H is formed, using the first section 25-1 of the patterned first gate structure 25a as a mask.

Referring to FIG. 3N, the first capacitor $C_{1N}$ may thus be defined by the patterned first gate structure 25a over the n-well 21, the n-well region 22 and the patterned first dielectric layer 24a therebetween. In operation, a control voltage may be applied to one of the source/drain regions 213 in the n-well 21 to control the accumulation and dissipation of hot carriers in the floating gate 25a.

Subsequently, referring to FIG. 3O taken along the line AA', a pick-up region 29 to serve as a contact in the p-well 22 may be formed by, for example, an n-type implantation process.

Figure 4A:
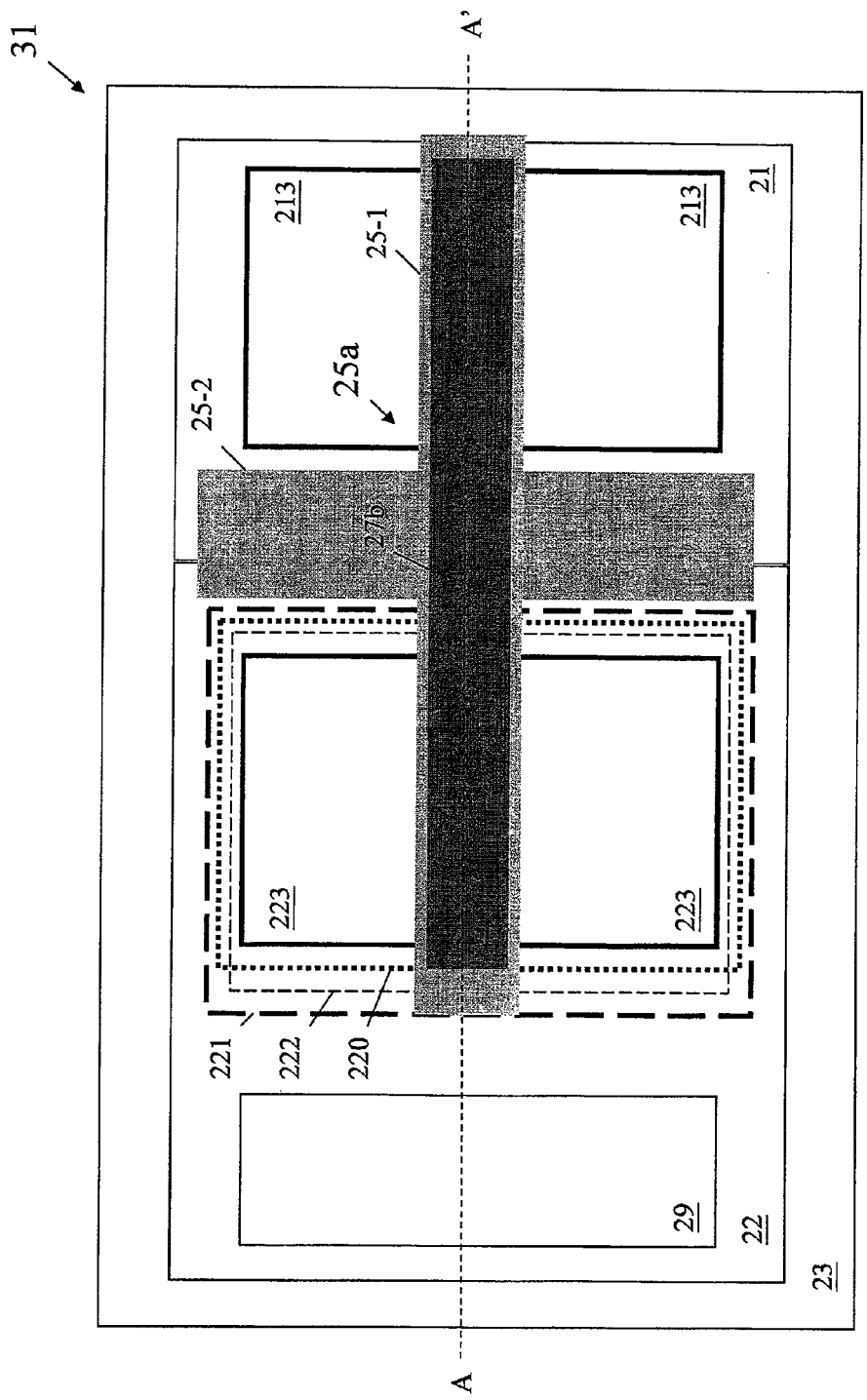
FIG. 4A is a plan view of a memory cell in accordance with another example of the present invention.

FIG. 4A is a plan view of a memory cell 31 in accordance with another example of the present invention. Referring to FIG. 4A, the memory cell 31 may be similar to the memory cell 30 described and illustrated with reference to FIG. 2A except that, for example, a patterned second gate structure 27b may extend in the first direction over the first section 25a-1 of the patterned first gate structure 25a. The patterned second gate structure 27b, which may entirely overlap the first section 25a-1, has an area equal to or smaller than that of the first section 25a-1.

Figure 4B:
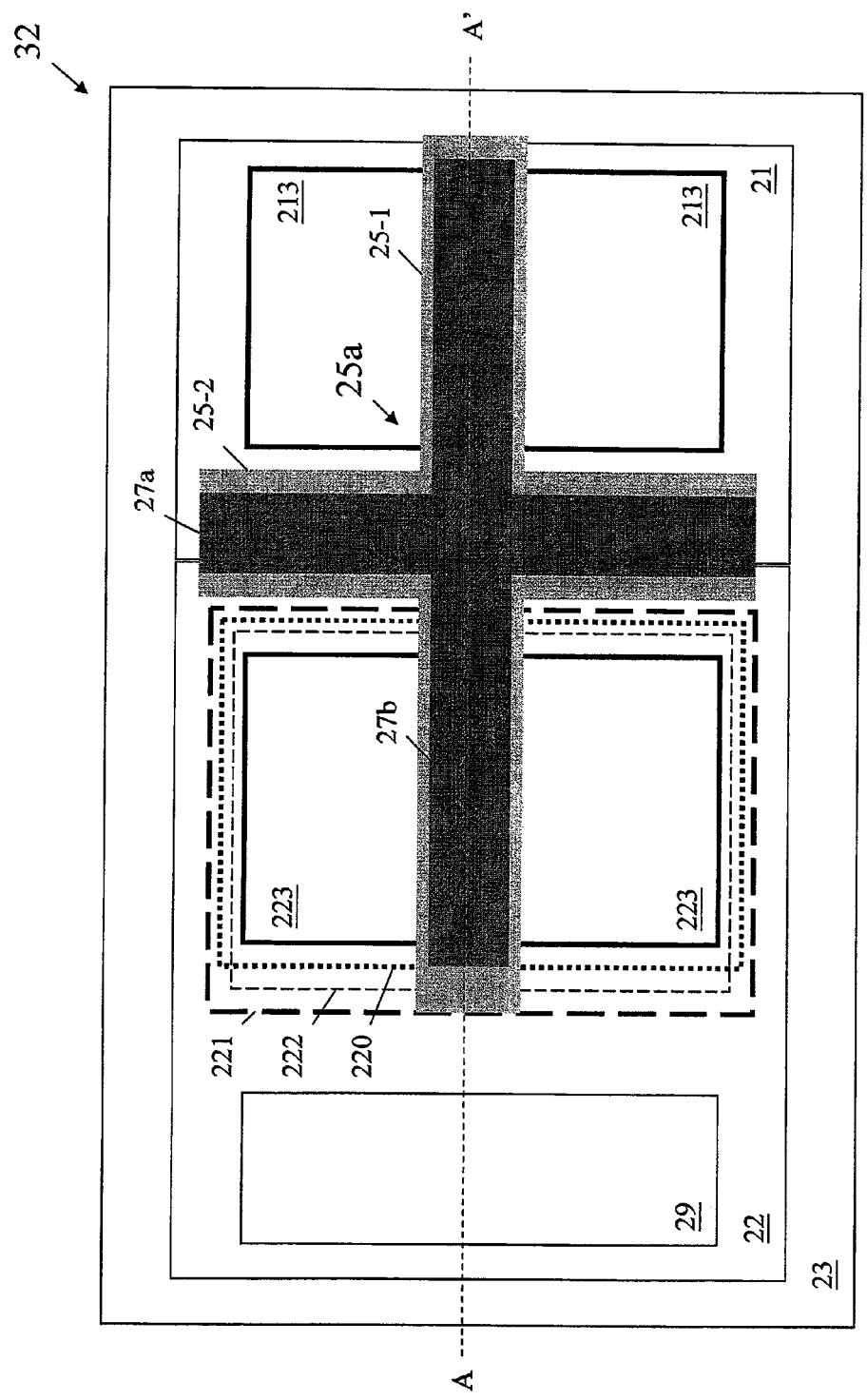
FIG. 4B is a plan view of a memory cell in accordance with still another example of the present invention.

FIG. 4B is a plan view of a memory cell 32 accordance with still another example of the present invention. Referring to FIG. 4B, the memory cell 32 may be similar to the memory cell 30 described and illustrated with reference to FIG. 2A except that, for example, a patterned second gate structure may include the first section 27b extending in the first direction over the first section 25a-1 of the patterned first gate structure 25a, and the second section 27a extending in the second direction over the second section 25a-2 of the patterned first gate structure 25a.

Figure 5A:
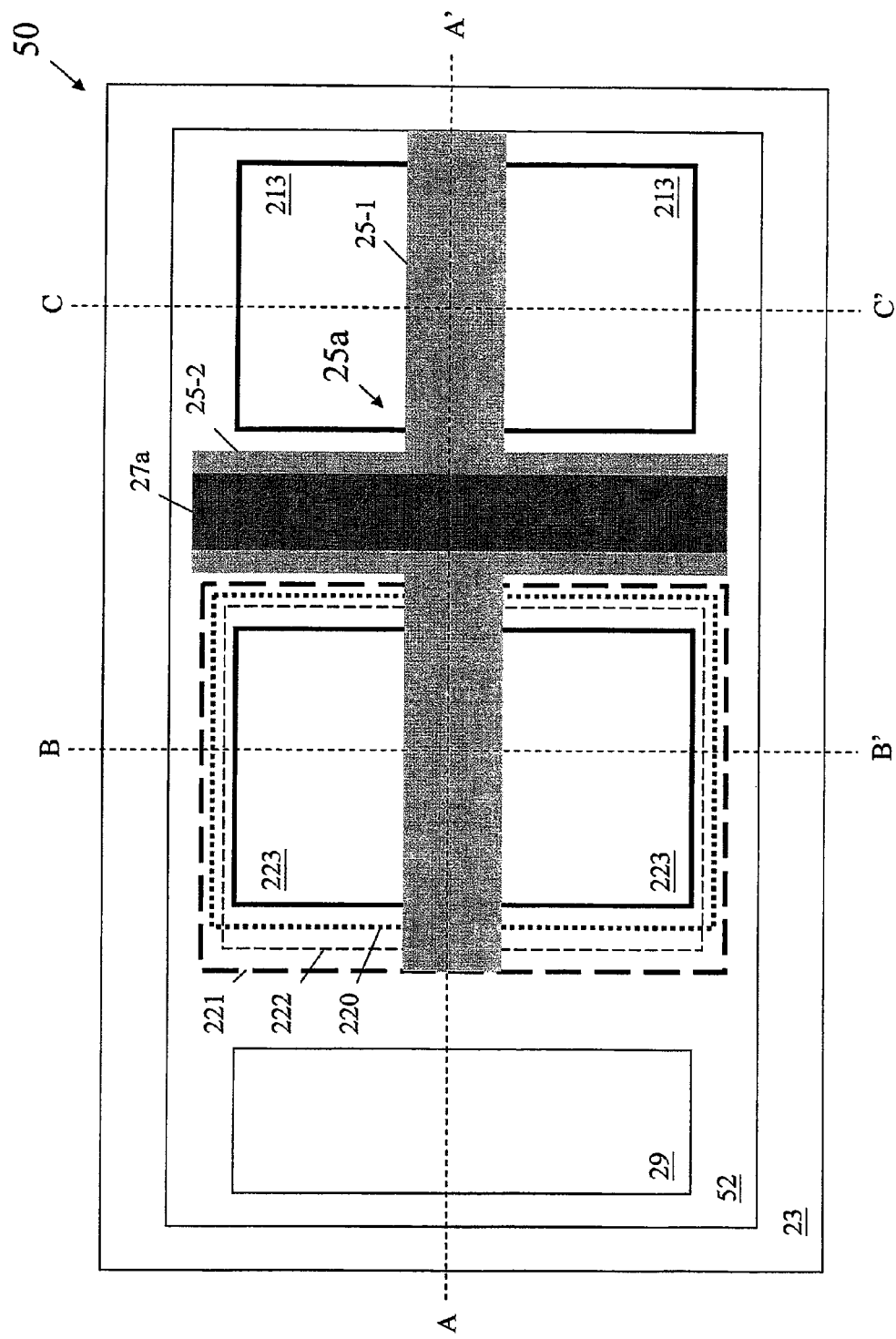
FIG. 5A is a plan view of a memory cell in accordance with another example of the present invention.

FIG. 5A is a plan view of a memory cell 50 in accordance with another example of the present invention. Referring to FIG. 5A, the memory cell 50 may be similar to the memory cell 30 described and illustrated with reference to FIG. 2A except that, for example, a p-type well region 52 replaces the n-well 21 and the p-well 22 in FIG. 2A. The p-well 52 may occupy the estates of the n-well 21 and p-well 22 illustrated in FIG. 2A and thus may have an area substantially equal to that of the n-well 21 plus the p-well 22.

Figure 5B:
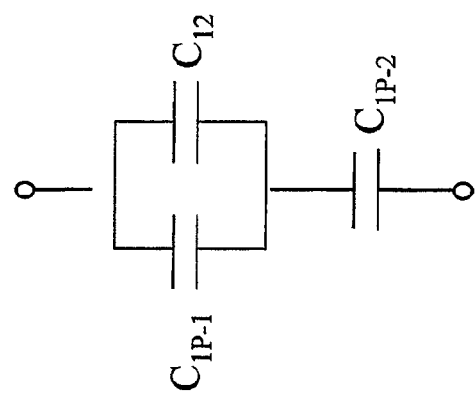
FIG. 5B is a diagram illustrating an equivalent circuit of the relevant capacitors of the memory cell illustrated in FIG. 5A.

FIG. 5B is a diagram illustrating an equivalent circuit of the relevant capacitors of the memory cell 50 illustrated in FIG. 5A. Referring to FIG. 5B, the GCR of the memory cell 50, denoted as GCR", may be expressed as a function of the relevant capacitances of the memory cell 50 in Equation (3) below.

$$GCR'' = \frac{C_{12} + C_{1P-1}}{C_{12} + C_{1P-1} + C_{1P-2}} \quad \text{Equation (3)}$$

where $C_{1P-1}$ represents the capacitance of a first capacitor in the p-well 52 at one side of the second section 25-2, and $C_{1P-2}$ represents the capacitance of a second capacitor in the p-well 52 at the other side of the second section 25-2.

Figure 6A:
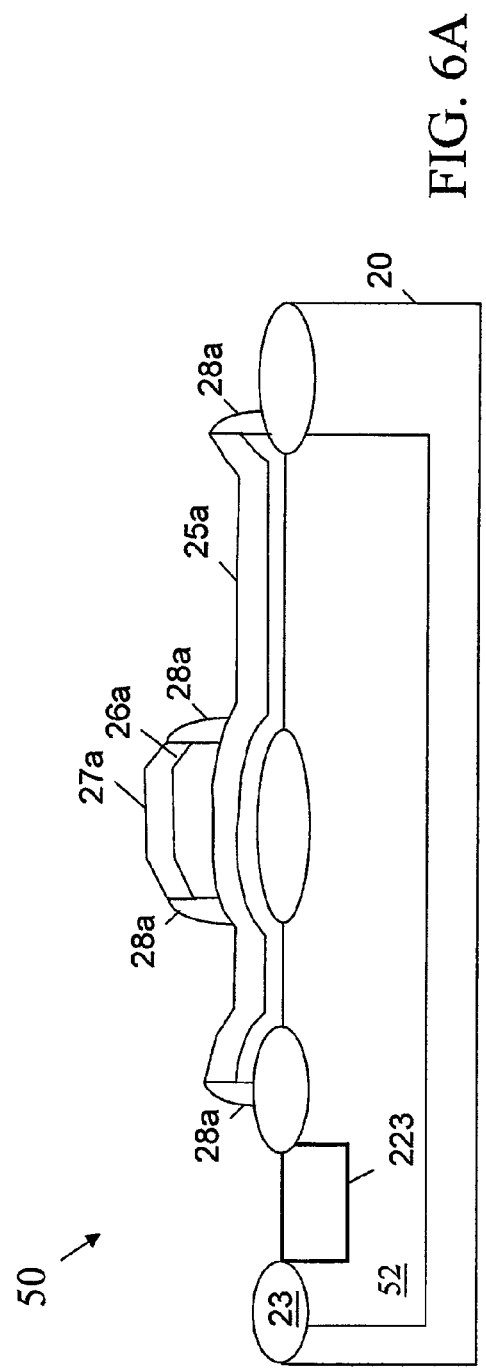
FIG. 6A is a cross-sectional diagram of the memory cell illustrated in FIG. 5A taken along a line corresponding to line AA'.

FIG. 6A is a cross-sectional diagram of the memory cell 50 illustrated in FIG. 5A taken along a line corresponding to line AA'. Referring to FIG. 6A, the memory cell 50 may be similar in structure to the memory cell 30 illustrated in FIG. 3O except that, for example, the p-well 52 replaces the n-well 21 and the p-well 22.

Figure 6B:
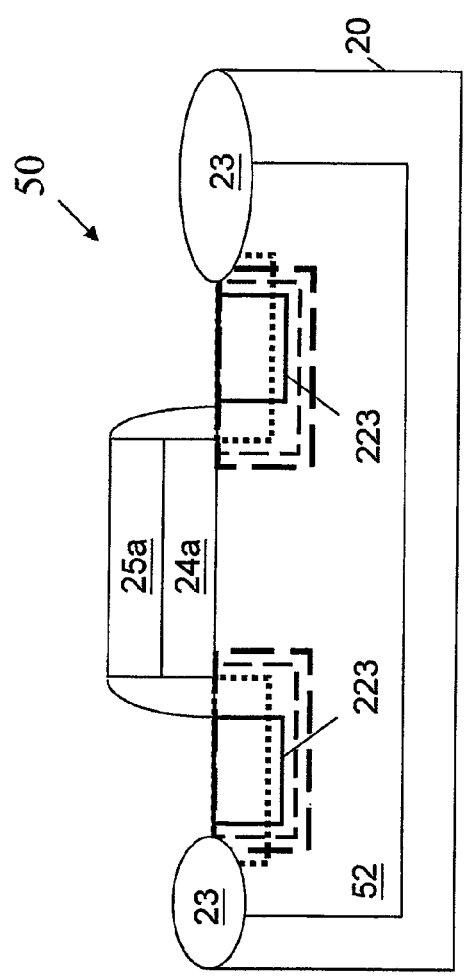
FIG. 6B is a cross-sectional diagram of the memory cell illustrated in FIG. 5A taken along a line corresponding to line BB'.

FIG. 6B is a cross-sectional diagram of the memory cell 50 illustrated in FIG. 5A taken along a line corresponding to line BB'. Referring to FIG. 6B, the memory cell 50 may be similar in structure to the memory cell 30 illustrated in FIG. 3M except, for example, the p-well 52.

Figure 6C:
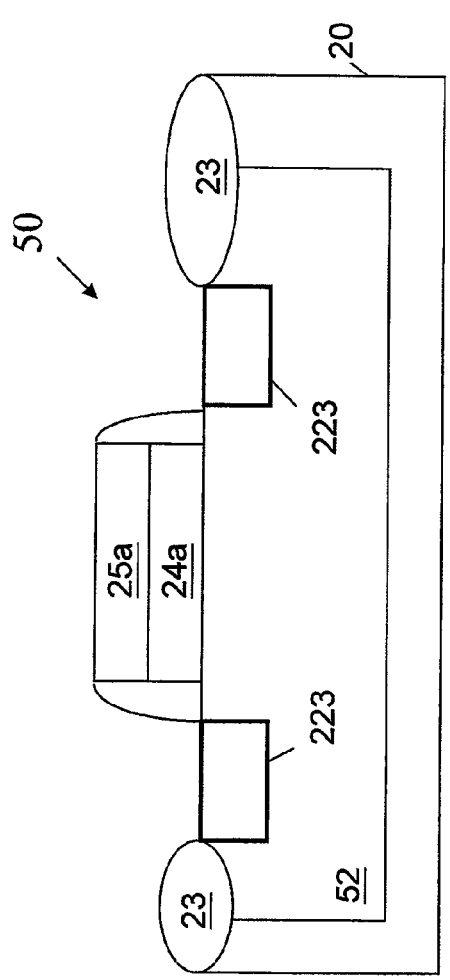
FIG. 6C is a cross-sectional diagram of the memory cell illustrated in FIG. 5A taken along a line corresponding to line CC'.

FIG. 6C is a cross-sectional diagram of the memory cell 50 illustrated in FIG. 5A taken along a line corresponding to line CC'. Referring to FIG. 6C, the memory cell 50 may be similar in structure to the memory cell 30 illustrated in FIG. 3N except, for example, the p-well 52.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A semiconductor memory device comprising:
   a substrate;
   a well region in the substrate having a same impurity type as the substrate;
   a patterned first dielectric layer on the substrate extending over the well region;
   a patterned first gate structure on the patterned first dielectric layer, the patterned first gate structure including a first section extending in a first direction and a second section extending in a second direction orthogonal to the first section, the first section and the second section intersecting each other in a cross pattern, wherein the second section of the patterned first gate structure has a first side and a second side opposite to the first side;
   a patterned second dielectric layer on the patterned first gate structure;
   a patterned second gate structure on the patterned second dielectric layer, the patterned second gate structure including at least one of a first section extending in the first direction over the first section of the patterned first gate structure or a second section extending in the second direction over the second section of the patterned first gate structure; and
   lightly doped drain (LDD) regions at the second side of the second section of the patterned first gate structure in the well region at both sides of the patterned first gate structure.

2. The semiconductor memory device of claim 1, of which gate coupling ratio (GCR) is expressed as a function of capacitances $C_{1P-1}$, $C_{1P-2}$ and $C_{12}$ in an equation:

$$GCR = \frac{C_{12} + C_{1P-1}}{C_{12} + C_{1P-1} + C_{1P-2}}$$

where $C_{1P-1}$ represents the capacitance of a first capacitor defined by the patterned first gate structure, the well region at the first side of the second section of the patterned first gate structure and the patterned first dielectric layer, $C_{1P-2}$ represents the capacitance of a second capacitor defined by the patterned first gate structure, the well region at the second side of the second section of the patterned first gate structure and the patterned first dielectric layer, and $C_{12}$ represents the capacitance of a third capacitor defined by the patterned first gate structure, the patterned second gate structure and the patterned second dielectric layer.

3. The semiconductor memory device of claim 1 further comprising a first pair of source/drain regions at the first side of the second section of the patterned first gate structure in the well region at both sides of the patterned first gate structure, wherein one of the source/drain regions is to couple with a control voltage.

4. The semiconductor memory device of claim 3 further comprising a second pair of source/drain regions at the second side of the second section of the patterned first gate structure in the well region at both sides of the patterned first gate structure.

5. The semiconductor memory device of claim 1 further comprising pocket regions at the second side of the second section of the patterned first gate structure in the well region at both sides of the patterned first gate structure.

6. The semiconductor memory device of claim 1 further comprising hot carrier implant regions at the second side of the second section of the patterned first gate structure in the well region at both sides of the patterned first gate structure.

7. The semiconductor memory device of claim 1, wherein the patterned first dielectric layer includes a first section extending in the first direction under the first section of the patterned first gate structure and a second section extending in the second direction under the second section of the patterned first gate structure.

8. The semiconductor memory device of claim 1, wherein the patterned second dielectric layer includes at least one of a first section extending in the first direction under the first section of the patterned second gate structure or a second section extending in the second direction under the second section of the patterned second gate structure.

* * * * *